Figure 1:
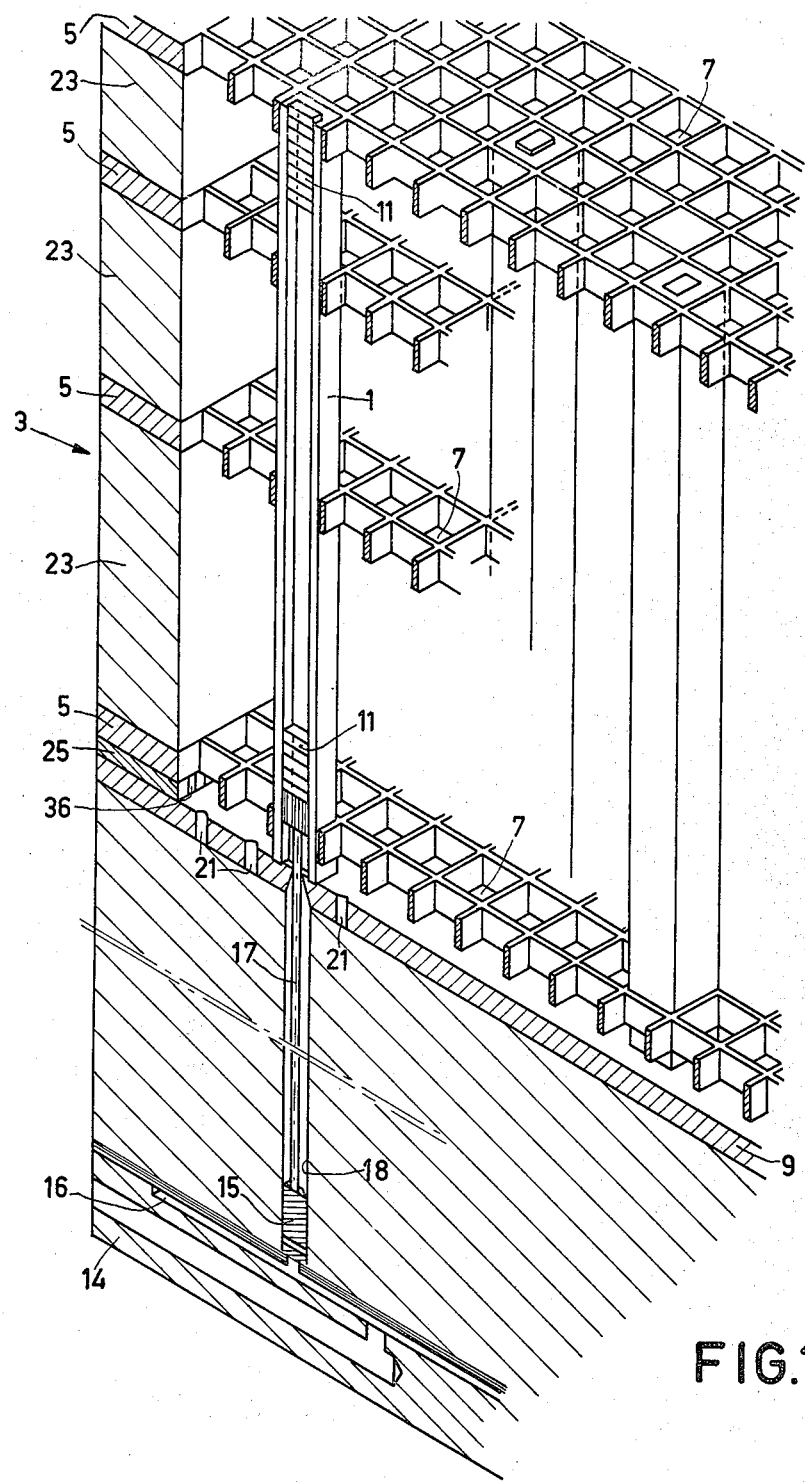

United States Patent [19]

Düll et al.

[11] 4,375,126

[45] Mar. 1, 1983

[54] DEVICE FOR MOUNTING PARTS ON PRINTED CIRCUIT BOARDS

[75] Inventors: Helmut Düll, Heide; Wilhelm Schreihage, Hartenholm, both of Fed. Rep. of Germany

[73] Assignee: U.S. Philips Corporation, New York, N.Y.

[21] Appl. No.: 181,607

[22] Filed: Aug. 27, 1980

[30] Foreign Application Priority Data

Aug. 30, 1979 [DE] Fed. Rep. of Germany ....... 2935081

[51] Int. Cl.³ .............................................. B23P 19/00
[52] U.S. Cl. ........................................ 29/740; 29/743; 29/832; 221/93; 414/121; 414/752
[58] Field of Search ................. 29/809, 832, 740, 743; 221/93; 414/121, 752

[56] References Cited

U.S. PATENT DOCUMENTS

| 3,479,716 | 11/1969 | Zanger et al. ................. 414/752 X |
| 3,859,723 | 1/1975 | Hamer et al. .................... 29/740 X |
| 4,116,348 | 9/1978 | Atchley et al. .................. 29/740 X |
| 4,127,432 | 11/1978 | Kuwano et al. ................. 29/740 X |
| 4,215,799 | 8/1980 | Swaine ............................... 221/93 |
| 4,221,533 | 9/1980 | Heim et al. ...................... 414/752 X |
| 4,292,116 | 9/1981 | Takahashi et al. ............... 29/809 X |

FOREIGN PATENT DOCUMENTS 1542614 3/1979 United Kingdom .

OTHER PUBLICATIONS

IBM Tech. Discl. Bull., vol. 18, No. 11, Apr. 1976, pp. 3696–3697, by T. Kehagiougiou.

Primary Examiner—Francis S. Husar
Assistant Examiner—Carl J. Arbes
Attorney, Agent, or Firm—Thomas A. Briody; William J. Streeter; Rolf E. Schneider

[57] ABSTRACT

A device and a method of automatically mounting plate-shaped chips on printed circuit boards, the chips first being aligned and positioned with respect to each other before they are glued onto the printed circuit board, after which the whole assembly of parts is soldered down.

12 Claims, 26 Drawing Figures

DEVICE FOR MOUNTING PARTS ON PRINTED CIRCUIT BOARDS

This invention relates to a device for and a method of mounting plate-shaped electrical parts on printed circuit boards, said parts being stacked in tubular magazines which are arranged in a given relative position with respect to each other which corresponds to the intended situation of the parts with respect to each other on the printed circuit board.

It is known to manufacture printed circuit boards by printing conductor tracks on a substrate of an insulating material, the conductor tracks being connected in accordance with the circuit pattern to be realised by means of electrical parts which are arranged on the insulating substrate. Generally, for these printed circuit boards use is made of parts comprising connection wires which are inserted through holes in the substrate and which are soldered down on the side of the conductor tracks. However, for miniaturization of these circuits the top as well as the bottom of the substrate is provided with conductor tracks, one side of the substrate preferably being provided with parts having connection wires which are inserted through the holes in the substrate and which project slightly beyond the plane of the other side of the substrate. The other side of the substrate is provided, in the spaces between the wire connections, with plate-shaped parts, so-called chips. Chips are to be understood to mean herein parts which do not include the conventional connection wires; these chips include either contact or connection parts or very short connection studs.

U.S. Pat. No. 4,127,432 describes a device for and a method of mounting plate-shaped or block-shaped electrical components on printed circuit boards; using this device, parts can be mounted on a printed circuit board which is provided in advance with quantities of an adhesive in a given number of positions on its lower side. These parts are transferred to the printed circuit board from a number of tubular magazines which are arranged in an array and in which the parts are stacked; each time the upper part of each stack in the individual magazines is pressed onto the corresponding quantity of adhesive on the printed circuit board.

The known device and the known method have a number of drawbacks which interfere with economic and accurate manufacture in bulk. Miniaturization of circuits is possible only up to a given extent, because the printed circuit board is provided with parts directly from the magazines containing stacks of parts. The magazines are comparatively large and a corresponding large space, including the required tolerances, must remain free between the locations on the printed circuit board where the parts are to be accommodated.

It is a further drawback of the known device that parts of different thicknesses cannot be simultaneously mounted on the printed circuit board. During one mounting operation only parts of substantially the same thickness can be handled, because the magazines which are arranged underneath the printed circuit board and which contain the parts are guided in the array of magazines so that the openings are always situated in one plane and the stepwise transport of the parts from the magazines takes place with substantially the same stroke; only the thickness tolerances of the individual elements are compensated for by the resilient mounting of the individual transport devices. When the distance between the openings of the magazines and the printed circuit board is such that each time only parts of the smallest thickness just contact the printed circuit board, thicker parts from the other magazines will not be released. If the distance between the openings of the magazines and the printed circuit board, however, is so large that the parts having the greatest thickness also emerge from the magazines, in given circumstances several parts will be simultaneously released from the magazines containing the parts having a smaller thickness, said several parts being loose, without guide and holder except for the one part which is retained by the printed circuit board by way of the adhesive provided thereon.

Moreover, in this known device it is not ensured that each time only a single part is taken from the magazines. The parts may stick for various reasons in practice. This drawback is not always eliminated by the magazine embodiment including resilient tongues as disclosed in such patent, because the operation thereof is dependent on the individual tolerances of the successive parts. For example, a part of smallest dimension between two parts of largest dimension within the tolerance limits of the parts of a magazine is not retained.

Perfect operation of the device, moreover, is strongly dependent on the shape of the magazines and imposes severe requirements as regards their uniformity which, however, is not always present when use is made of magazines from different manufacturers.

It is to be noted that an absolute reliable separation of the parts after release from the magazines is a condition to be satisfied in order to obtain perfect mounting of these elements on the printed circuit boards.

The present invention has for its object to provide a device for and a method of mounting plate-shaped electric parts (chips) on printed circuit boards which enables the simultaneous mounting of a large number of such parts on a printed circuit board at a substantially smaller distance from each other in comparison with the known device, a large number of parts of different thicknesses being simultaneously arranged on the printed circuit board in a single operation, whilst the separation of the parts is definitely ensured, even in the case of different thicknesses.

This object is achieved in accordance with the invention in that there is provided a device for mounting plate-shaped parts on printed circuit boards comprising a transfer plate which is situated opposite the openings of the magazines and which serves for transferring the parts from the magazines to the printed circuit board, the transfer plate having a large number of removably mounted evacuatable suction tubes for the transfer of the parts, said tubes projecting from the transfer plate.

In a preferred embodiment of the device, the free lengths of the suction tubes projecting from the transfer plate differ and correspond to the difference in thickness of the parts to be transferred by the individual suction tubes.

The overall length of the suction tubes and the distance between the transfer plate and a calibration plate are chosen so that the parts can be pressed onto the printed circuit board in spite of any projecting parts such as wire ends already present thereon. It is thus achieved that parts of different thicknesses can be simultaneously handled by the mounting device, the parts being situated, in spite of different thicknesses, in one plane for mounting on the printed circuit board, the removal of parts from the magazines always being adjustable so that actually only one part can be removed from each of the magazines.

In a further preferred embodiment in accordance with the invention, a calibration plate which cooperates with the transfer plate and which is slidable in the x and/or y direction with respect thereto, is arranged between the transfer plate and the printed circuit board, said calibration plate comprising a number of openings which correspond to the parts to be transferred and in which the parts fit with a clearance, the suction tubes for the transfer of the parts projecting into said openings so far that within the openings a free space remains which just corresponds to the thickness of the parts to be transferred from the magazines. The calibration plate is composed of conical, separate calibration elements with openings which are arranged according to a matrix. Thus, extremely accurate centring and positioning of the parts with respect to the locations on the printed circuit board where parts are to be provided can be achieved and switching over to other circuit patterns can be very simply performed by corresponding rearrangement of the calibration elements.

A further preferred embodiment in accordance with the invention is characterized in that it comprises auxiliary devices for the application of adhesive to the printed circuit board and/or to the parts by means of stamps which are arranged in a plate and whose number and position correspond to the locations on the printed circuit board to be provided with the parts or to the parts, respectively; these stamps enable extremely accurate application of adhesive. It is even possible to provide printed circuit boards which are not flat and on which parts are already present with adhesive in an extremely accurate manner, because on the one hand the individual stamps comprise a head of an elastic material, whilst on the other hand, because of the very small cross-sections which correspond substantially to those of the parts, they can be readily made to contact surfaces between parts already arranged on the printed circuit board.

A further embodiment in accordance with the invention relates to the construction of a matrix holder for the magazines. The individual magazines can be extremely quickly arranged in the matrix holder and are very well guided, centred, positioned and retained therein, because the matrix holder consists of several matrix frames which are arranged at a distance from each other and in the openings of which the magazines can be arranged, the last frame being covered with a cover plate, the distance between the matrix frames increasing continuously in the direction of the cover plate, because the cross-section of the openings in the matrix frames continuously decreases in the direction of the cover plate, because the cross-section of the smallest openings in the matrix frame arranged adjacent the cover plate corresponds substantially to the cross-section of the magazines, and because the openings in the individual matrix frames are conical, their largest cross-section being situated at the side of the matrix frames remote from the cover plate.

In further preferred embodiments in accordance with the invention, the suction tubes are adjustably mounted in the transfer plate for slight axial displacement with respect thereto and are interchangeable. The suction tubes have cross-sections which are proportional to the cross-sections of the components to be retained. This embodiment of the suction tubes is important when the parts to be retained are extremely small, because in order to enable holding of these parts by means of the evacuatable tubes, considering the usually rectangular shape of the parts, a large part of the retaining surface would be lost if the tubes were round.

Round suction tubes whose manufacture is easier than tubes having a rectangular cross-section, however, can be advantageously used when parts having comparatively large dimensions and a correspondingly larger retaining surface have to be retained and transported.

A further preferred embodiment in accordance with the invention is characterized in that it comprises a transport device which includes for each magazine a transport piston for the step-wise transport of the parts, the transport pistons being slidable in bores of a pressurized distribution box for a pressure medium, all the bores communicating with a space filled with the pressure medium.

This transport device is preferably constructed so that the distribution box can be lifted, by way of a separate activation device, in order to be pressurized, the distribution box including a switching piston with a plunger which is subject to a counter-pressure and which limits the displacement of the distribution box via a switch.

The transport pistons preferably have a needle-like tip at their end facing the magazines. The pressure medium may be a gas, notably air, or a viscous, notably paste-like liquid which cannot be compressed.

An extremely accurate and fine pressure adjustment and hence a very accurate individual stroke of the transport pistons can be achieved notably when the pressure medium is a viscous, paste-like liquid. Such an individual activation of the transport piston enables parts of very diverse thicknesses to be arranged from the magazines against the suction tubes in a single operation by means of a single device.

Mounting plate-shaped electrical parts on printed circuit boards by means of the present method is performed so that the parts are shifted in the magazines unitl they contact and are retained by the evacuated suction tubes which are situated opposite the openings of the magazines in the transfer plate and whose number and position correspond to the locations of the printed circuit board to be provided with parts, the parts being transferred by displacement of the transfer plate, to the mounting locations on the printed circuit board, where they are retained by means of an adhesive applied to the printed circuit board and/or to the parts.

According to a further preferred method in accordance with the invention, the transfer plate with the suction tubes is arranged with respect to the calibration plate, comprising a number of openings which correspond to the suction tubes, so that the suction tubes for transferring the parts project into the openings so far that within the openings a free space remains which just corresponds to the thickness of the parts to be transferred from the magazines, after which each time a part is slid against the suction tubes in the openings and is retained thereby, the transfer plate being shifted, together with the calibration plate, in the x and/or y direction with respect to the magazines near the calibration plate, so that the openings of the magazines are at least partly covered by the calibration plate.

The movement of the transfer plate and the calibration plate is preferably performed so that, after the taking-over each time of one part by means of the suction tubes, the transfer plate is turned over together with the calibration plate. As a result, the parts taken over from the magazines are situated on the same side again in the device as the openings of the magazines, so that all operations of the device can be performed from one side. This enables particularly easy and also automatic testing and remeasurement of the individual parts if necessary. The adhesive can be also readily applied in this turned-over position of the transfer plate. Moreover, the printed circuit board can thus be provided, for example, with parts from the lower side; this offers the advantage that the printed circuit board need not be turned over between the mounting of other parts from the upper side and the mounting of the plate-shaped parts from the lower side. Other parts mounted on the printed circuit board before the mounting of the plate-shaped parts cannot drop off the printed circuit board and, therefore, need not be soldered to the printed circuit board in advance.

The advantages obtained by means of the invention consist in that a large number of plate-shaped parts of very diverse thicknesses and cross-sections can be simultaneously positioned on a printed circuit board in the locations to be provided with the parts, because the suction tubes can be individually mounted and their lengths can be selected in accordance with the thicknesses of the parts to be retained thereby, so that the parts to be transferred to the printed circuit board are all situated in one plane, even though the thicknesses of the individual parts may differ greatly.

A further advantage of the invention consists in that the step-wise transport of the parts in the magazines can be performed with an individual stroke which corresponds to the thicknesses of the parts stacked in the magazines.

A further advantage in accordance with the invention consists in that absolute sure separation of the parts removed from the magazines is achieved in that each time after the shifting of one part from the magazines against the suction tubes, the calibration plate with the transfer plate is shifted relatively with respect to the magazines in the x and/or y direction, so that the individual parts removed from the magazines can be slid over the edge of the magazines and the magazines are partly covered by the calibration plate, so that the removal of other parts from the magazines during this phase is prevented.

It is a further advantage that the locations on the printed circuit board at which parts are to be provided may be situated at a distance from each other which only need be slightly larger than the part itself in an extreme case, because the parts can be extremely accurately positioned and centred by means of the device in accordance with the invention and can, moreover, be positioned on very small areas on the printed circuit board, because the suction tubes carrying the parts themselves have only very small cross-sections which correspond proportionally to the cross-sections of the parts to be retained, but are slightly smaller than these cross-sections.

Another advantage obtained by means of the invention consists in that by means of the pressure-controlled, stepwise transport of the parts in the magazines, the pressure medium being a gas or notably a viscous liquid which cannot be compressed, a simultaneous, individually different stroke of the stacks of parts, depending on the thicknesses of the parts present in the individual stacks, can be obtained by means of a single device.

It is another advantage of the invention that the mounting device in accordance with the invention can be readily integrated in the existing machinery of a manufacturing plant. As has already been stated, printed circuit boards can first be readily provided with conventional parts with connection wires and these printed circuit boards with parts can subsequently be provided during a next step, preferably before the soldering of all parts, with plate-shaped parts by means of the device and the method in accordance with the invention, only very small areas being required for the mounting of the latter parts between the parts already present on the printed circuit board, because the adhesive can be applied also between projecting parts thanks to the separate stamps, the suction tubes used for arranging the parts on the printed circuit having, as described, an even smaller cross-section than the parts themselves and also such a length that they can reach as far as the printed circuit board in between projecting parts already present on the circuit board.

For such a method of mounting it is advantageous that the stamps enable the adhesive to be locally applied in a controlled manner in selected locations to be provided with parts.

Figure 2:
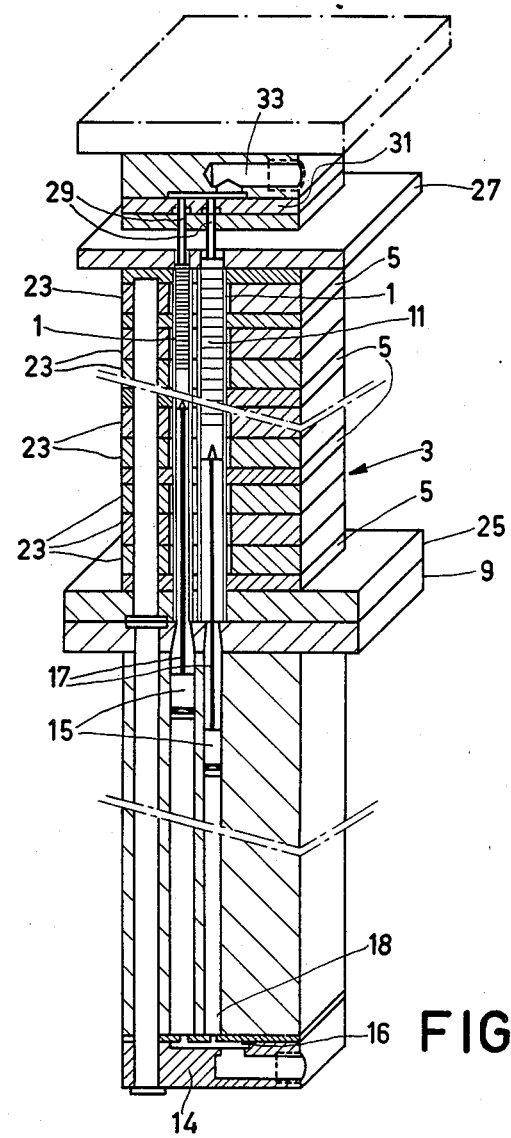
Figure 3:
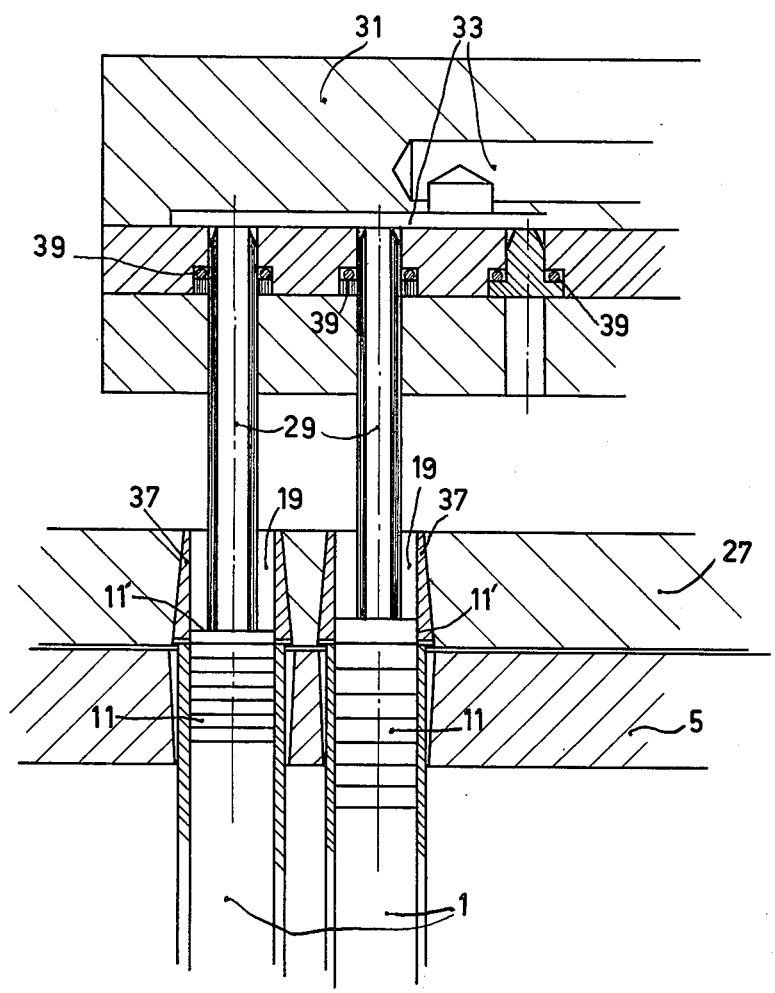
Figure 4:
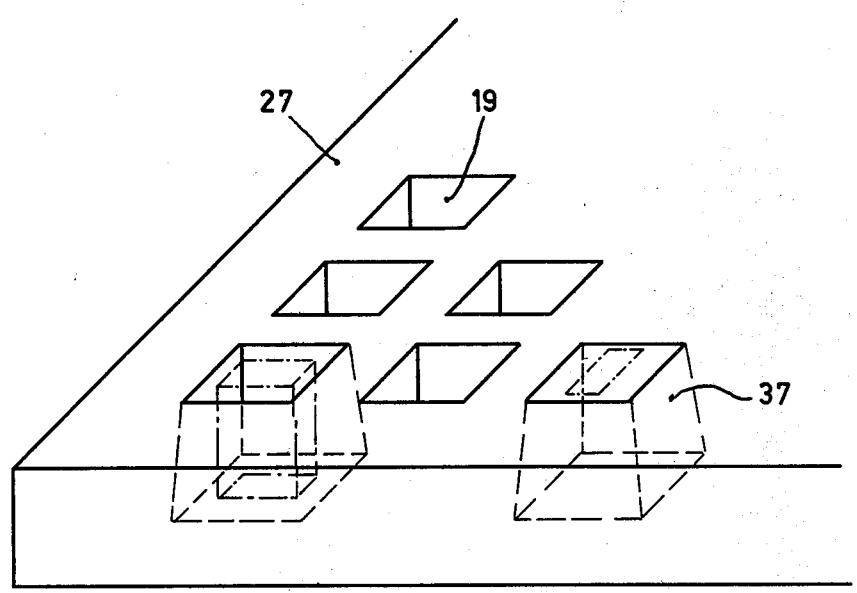
Figure 4:
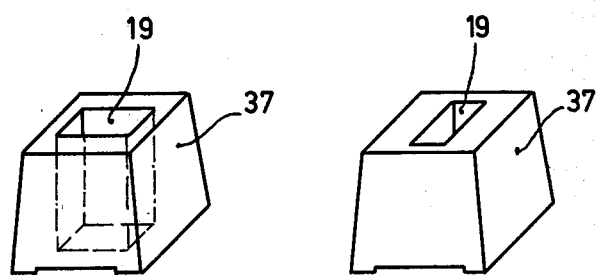
Figure 5A:
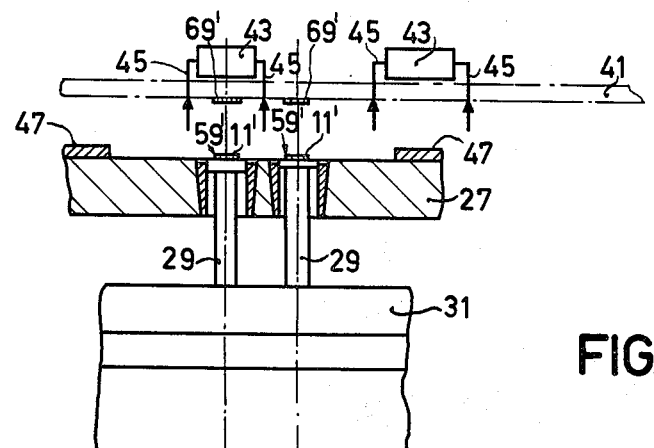
Figure 5B:
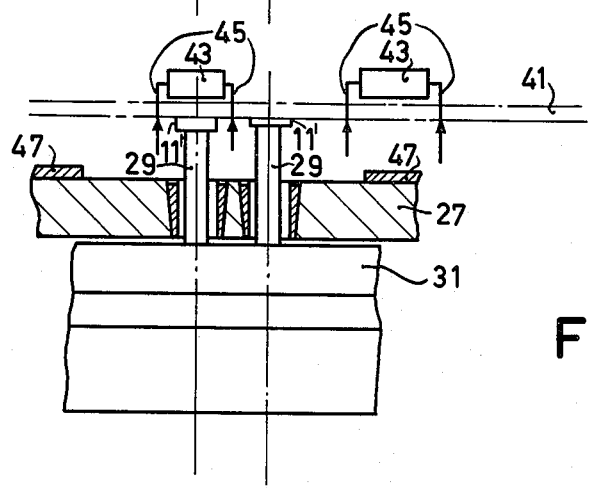
Figure 5C:
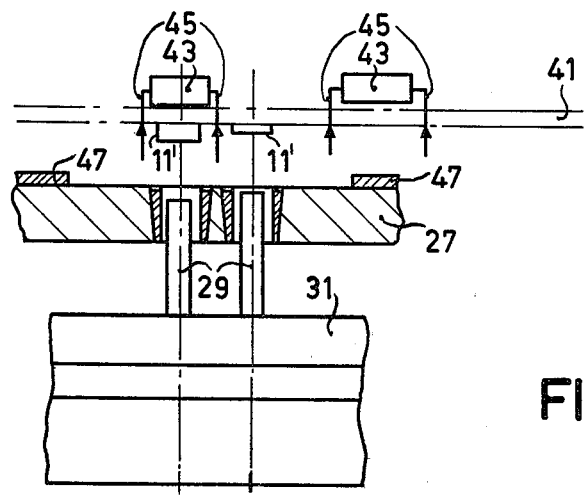
Figure 6A:
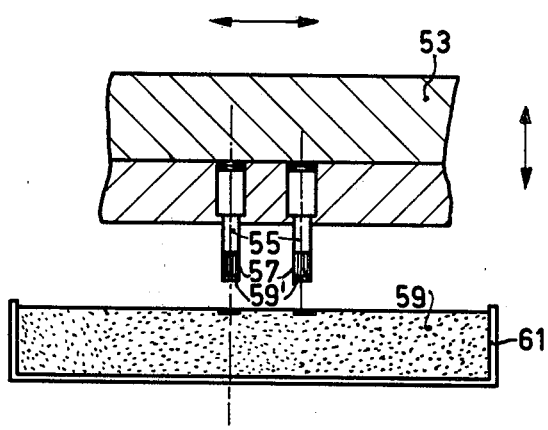
Figure 6B:
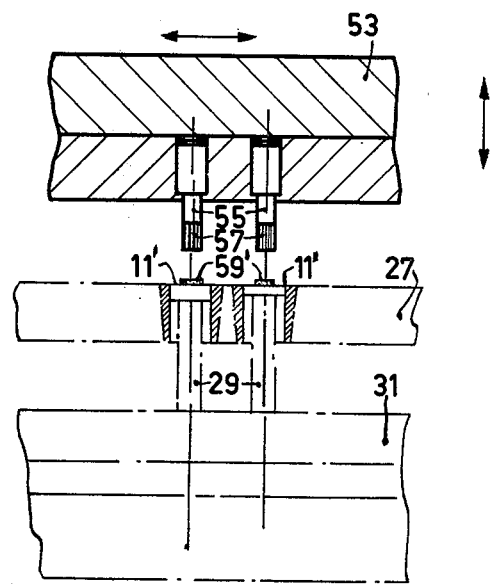
Figure 8A:
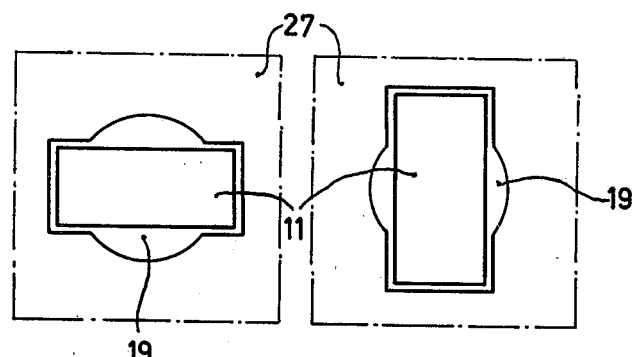
Figure 8B:
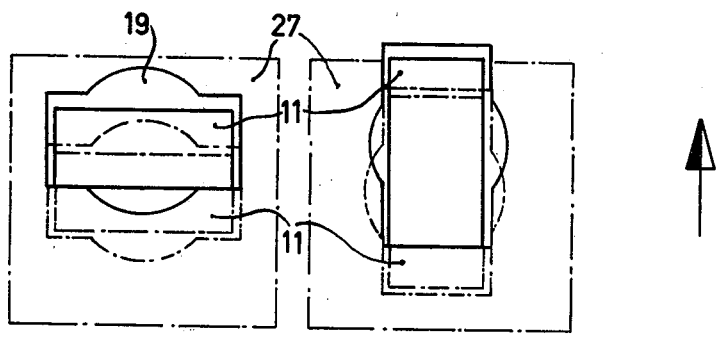
Figure 8C:
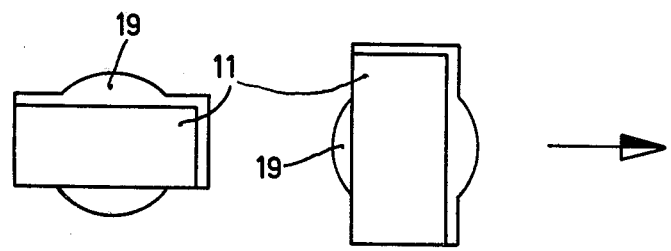
Figure 8D:
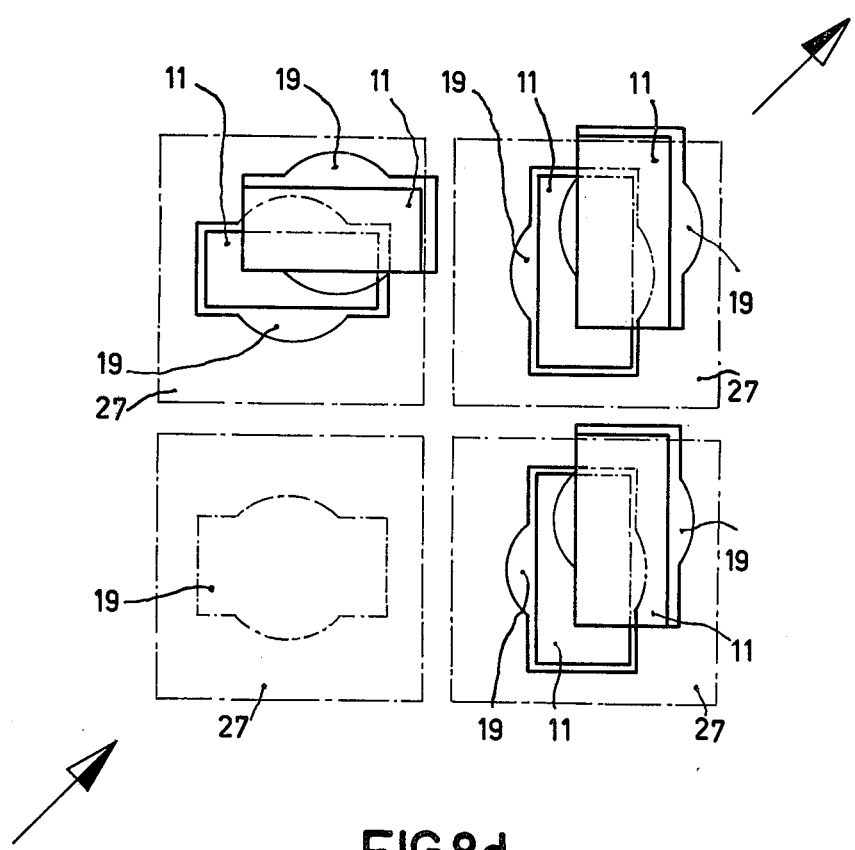
Figure 9A:
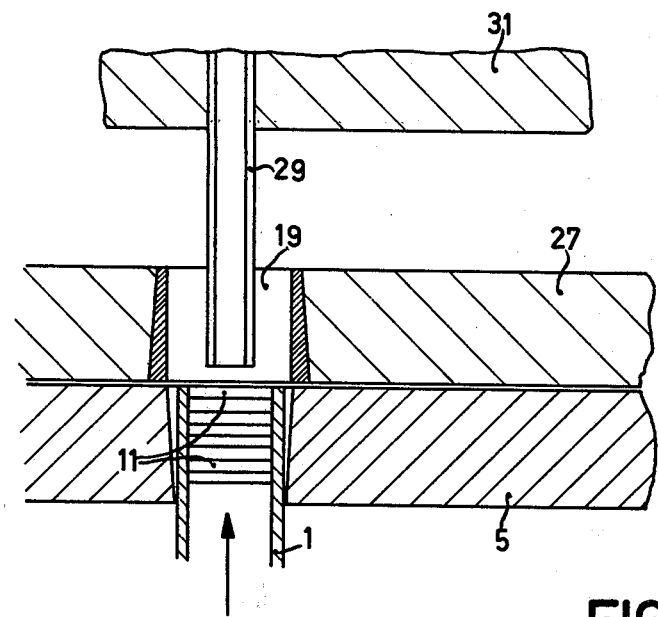
Figure 9B:
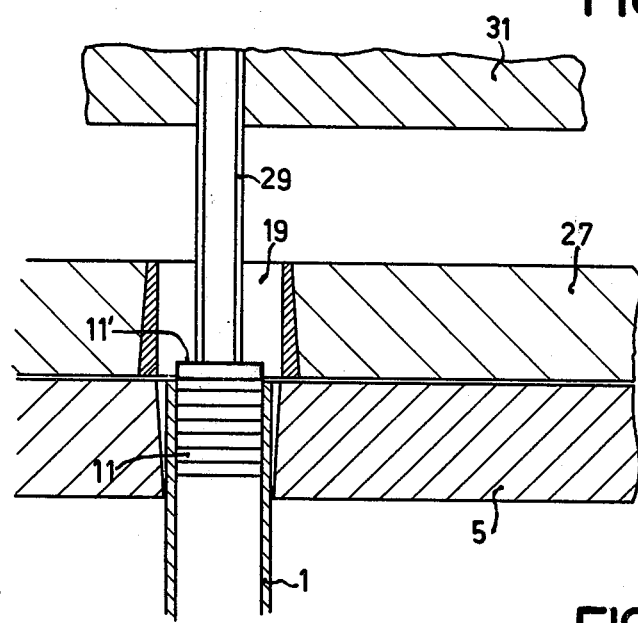
Figure 9C:
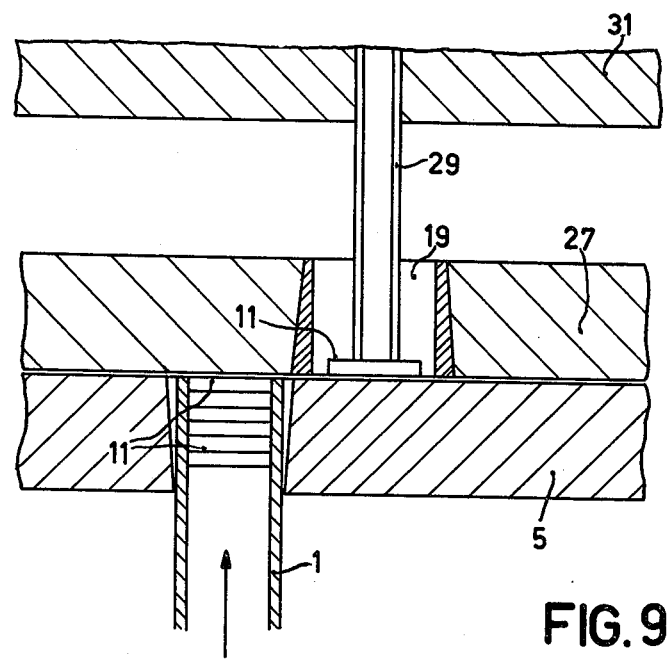
Figure 9D:
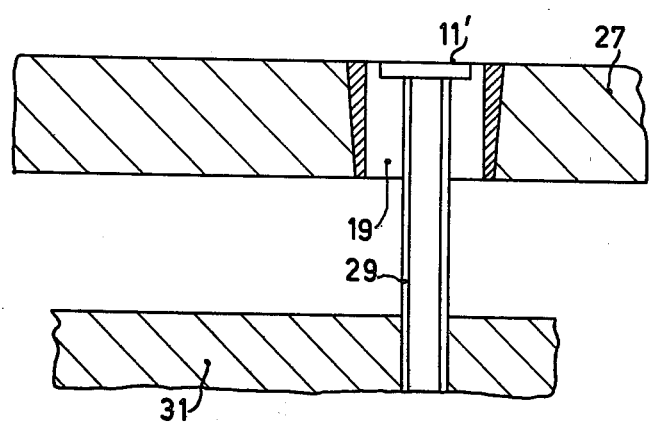
Figure 9E:
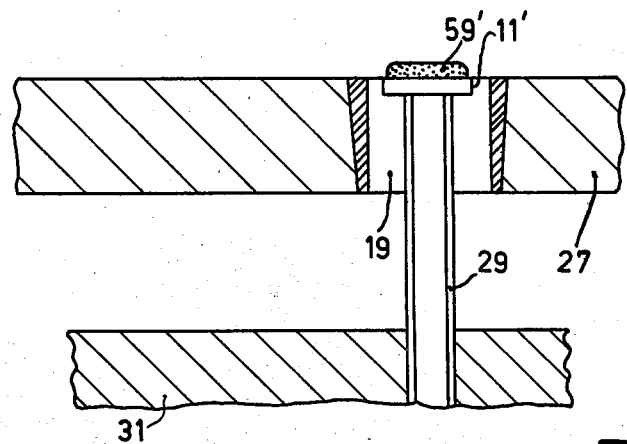
Figure 9F:
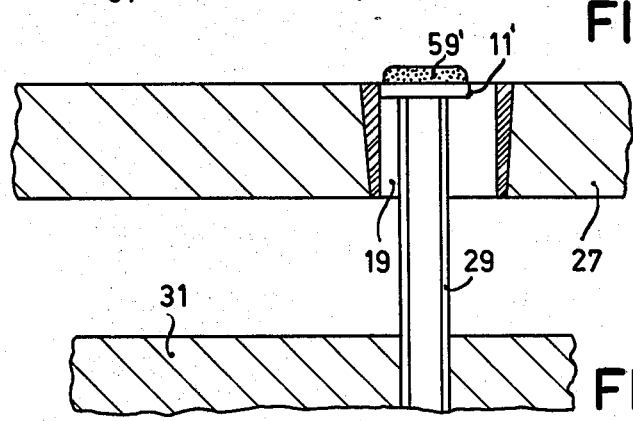
Figure 9G:
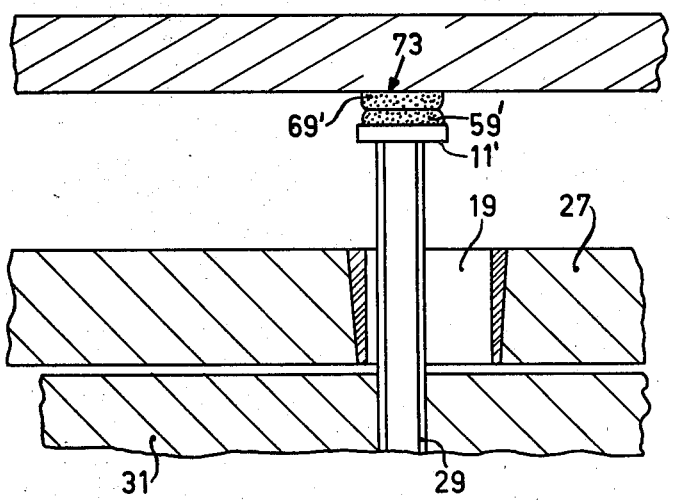
Figure 10:
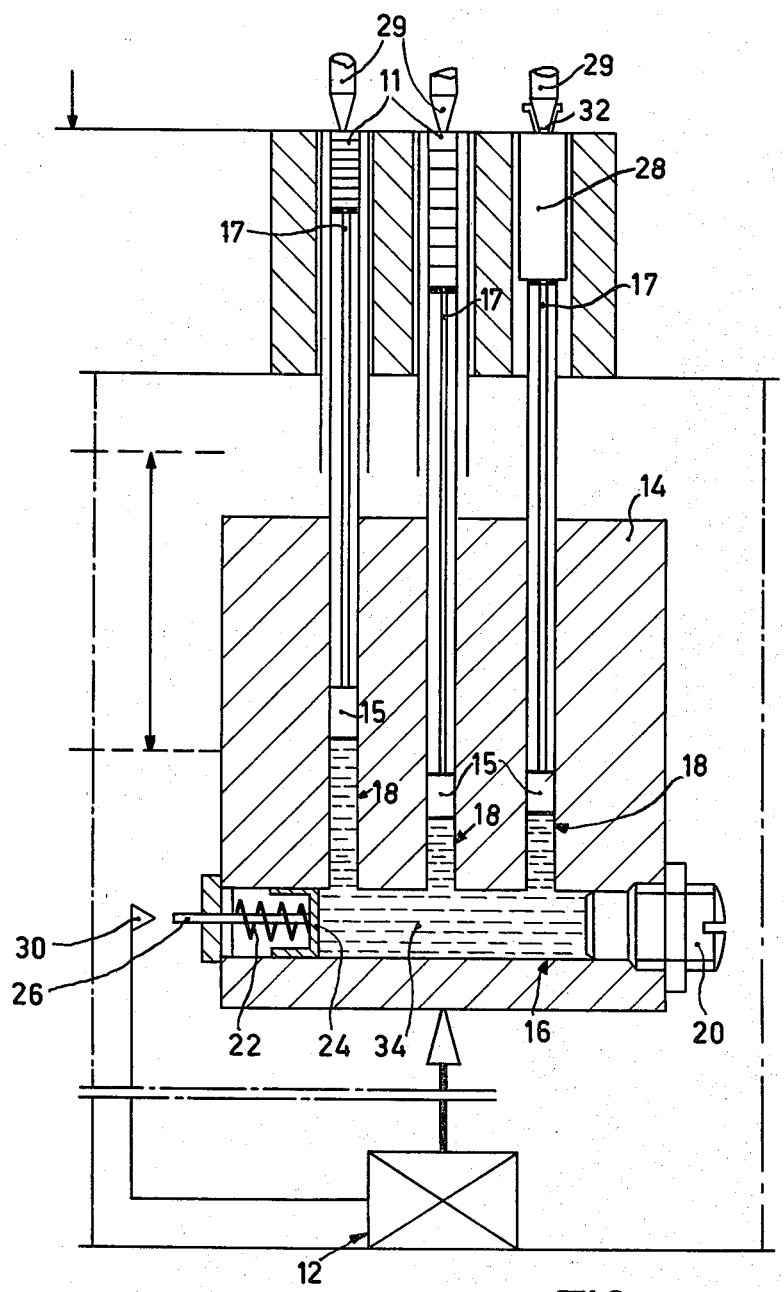
Figure 11:
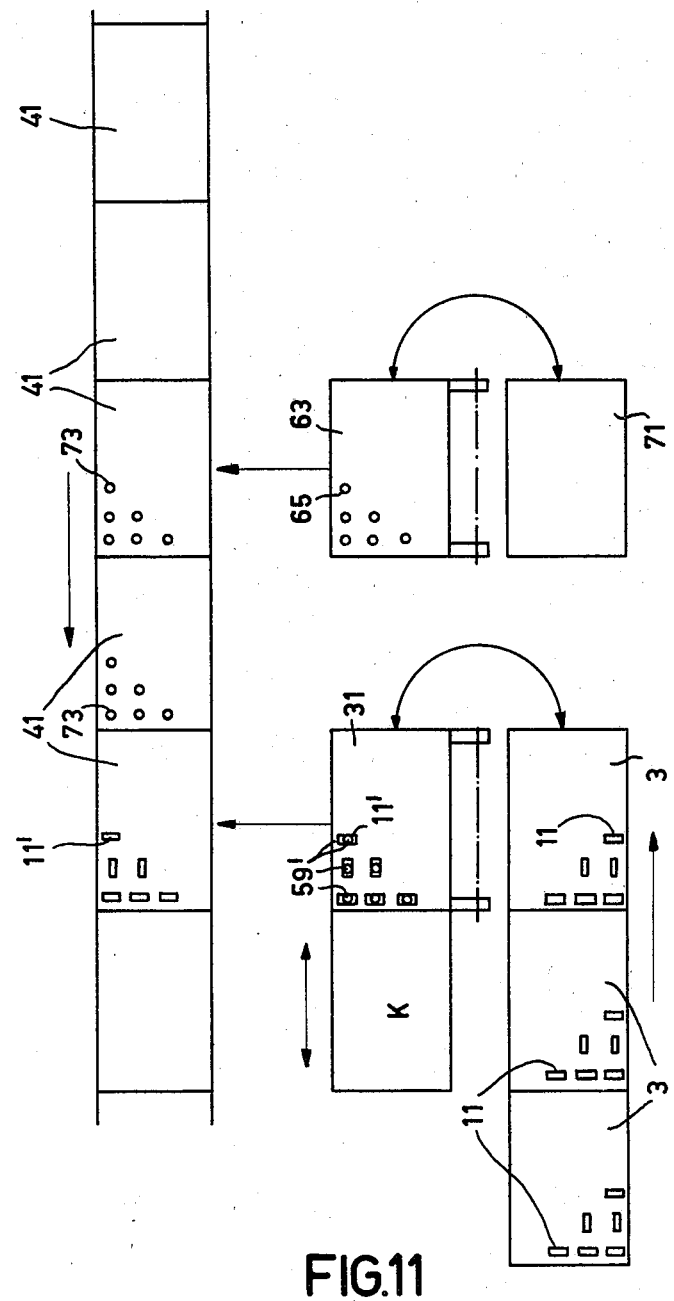

The invention will now be described in detail hereinafter with reference to the accompanying drawings in which:

FIG. 1 is a perspective sectional view of a magazine with parts which is arranged in a matrix holder and a relevant transport device, FIG. 2 is a perspective view of a transfer unit and of the transport device, FIG. 3 is a sectional view on an enlarged scale of the transfer unit shown in FIG. 2, FIG. 4 is a perspective view on an enlarged scale of the calibration plate shown in FIG. 2, FIGS. 5a, 5b, and 5c show a printed circuit board to be provided with parts and the transfer unit in different positions during the execution of the method, FIGS. 6a and 6b are sectional views of a device for the application of adhesive to parts in two positions, FIGS. 7a, 7b, 7c, and 7d show a device for the application of adhesive to printed circuit boards in various positions, FIGS. 8a, 8b, 8c, and 8d diagrammatically illustrate the operation of the calibration plate shown in FIG. 2, FIGS. 9a, 9b, 9c, 9d, 9e, 9f and 9g illustrate the principle of the cooperation between the calibration plate and the transfer plate, FIG. 10 shows the transport device on an enlarged scale, and FIG. 11 diagrammatically shows the separate steps of the method.

FIG. 1 shows a hollow tubular magazine 1 in a matrix holder 3 which comprises several matrix frames 5. The matrix frames 5 have conical openings 7, the largest cross-section of the conical openings 7 being each time remote from a cover plate 9 which covers the frames 5. The frames 5 are arranged at a distance from each other which increases in the direction of the cover plate 9. The arrangement of the conical openings 7 of the frames 5 offers the advantage that the magazines 1 with the stacks of plate-shaped parts 11 can be particularly quickly and simply inserted into the frames 5, because the largest cross-section of the conical openings 7 is situated at the inlet side for the magazines 1, the magazines 1, however, being guided very well by the tapered design. The distance between the frames 5 which increases in the direction of the cover plate 9 offers the advantage that the matrix holder 3 is very light and the magazines are suitably and accurately retained and guided, in spite of the total length. In order to provide a large number of parts on a printed circuit board in one operation, a large number of magazines is arranged in a position with respect to each other in the conical openings 7 which corresponds to the relative position of the parts with respect to each other to be realized on a printed circuit board. For the transport of the plate-shaped parts 11 in the magazines 1, on the side of the cover plate 9 which is remote from the matrix holder 3 there is arranged a distribution box 14 for a pressure medium 34 (FIG. 10) for the displacement of transport units which consist of a transport piston 15 each provided with a needle-shaped tip 17, said distribution box being moved upwards by a drive device 12 (FIG. 10). The transport pistons 15 are guided in bores 18 which are interconnected via a space 16 which is filled with the pressure medium 34, for example, air or a viscous liquid which cannot be compressed. This communicating system compensates for the necessarily different strokes of the individual transport pistons 15. The needle-shaped tips 17 pass through openings 21 in the cover plate 9 (only four of these openings 21 are shown in the drawings for the sake of clarity), the plate-shaped parts being transported at the rate at which they are removed from the magazine 1. The distance respectively required between the frames 5 is adjusted by means of spacers 23. Reference numeral 25 denotes a spacer plate which is provided with grooves 36 and which ensures that, should no pressure be built up in the guide between the magazines 1 due to leakage of the individual transport pistons 15, no contamination of the individual parts 11 and disturbance of the transport can occur.

FIG. 2 diagrammatically shows the transport of plate-shaped parts 11 of different thicknesses in two magazines 1 by the transport pistons 15 and their needle-shaped tips 17. The magazines 1 are situated in the matrix holder 3, the matrix with the frames 5 of this holder not being shown in the drawings. The transport pistons 15 are combined in a distribution box 14 for a pressure medium and are exposed to the pressure medium 34 present in the space 16 and the bores 18. The drive unit 12 lifts the distribution box 14 until the needles 17 slide the parts 11 in a corresponding manner; they slide the stack of plate-shaped parts 11 first in the direction of a calibration plate 27 (to be described in detail hereinafter) until the plate-shaped parts 11 contact the suction tubes 29. The pressure exerted on the space 16 can be transferred by the pressure medium to a pressure sensor (not shown) which in its turn switches off the transport movement for the distribution box 14. The pressure deficiency in the suction tubes 29 is created via the bores 33. It is possible to arrange the suction tubes 20 individually in the transfer plate 31 so that use can be made of tubes of different lengths in order to enable plate-shaped parts of different thicknesses (shown in FIG. 2 for two stacks of parts in two magazines 1) to be picked up by the suction tubes 29 so that all the parts 11 retained by the suction tubes 29 are situated in one plane, in spite of their different thicknesses. Using the transfer plate 31, parts of different thicknesses thus be transferred in a single operation to a printed circuit board to be provided with parts.

FIG. 3 shows the transfer plate 31 with the suction tubes 29. The plate-shaped parts 11 (of different thicknesses) are present in the magazines 1. Each time one part 11' is shifted into the calibration plate 27 where it contacts a suction tube 29. The calibration plate 27 has openings 19 which vary in accordance with the dimensions of the parts to be transferred to the printed circuit plate and which should preferably are slightly larger than these parts.

In order to achieve suitable matching of the various sections of the complete device to the various dimensions of the parts, the calibration plate 27 is constructed as a frame in which conical portions 37 (see also FIG. 4) having different openings can be arranged.

The suction tubes 29 are slightly axially displaced with respect to the transfer plate 31 by means of springs 29 in order to achieve soft positioning of the parts 11' retained by the suction tubes 29 on a printed circuit board and to compensate for the thickness tolerance of the individual parts to be mounted.

FIGS. 5a to 5c illustrate the transfer of the parts 11' to a printed circuit board 41 by means of the suction tubes 29. On the side of the printed circuit board 41 which faces the transfer plate 31, parts 43 comprising connection wires 45 have already been mounted during a preceding mounting step. Thanks to the very small dimensions of the suction tubes 29 which have a slightly smaller cross-section than the plate-shaped parts 11' to be arranged on a printed circuit board, the plate-shaped parts 11' can be extremely accurately positioned between the connection wires 45 of the parts 43, very accurate guiding of the parts 11' being ensured by the calibration plate 27. Abutments 47, having a height corresponding to the free length of the connection wires 45 inserted through the printed circuit board 41 (this height should be slightly larger), ensure that the calibration plate 27 cannot abut against the connection wires projecting through the printed circuit board 41.

FIG. 5a shows the suction tubes 29 in a first phase of the process where they just pass the calibration plate 27, together with the plate-shaped parts 11' retained thereby. During a preceding mounting step, a quantity 69' of one component of a two components contact glue has been deposited at the locations to be provided with parts. In another preceding mounting step, a quantity 59' of the other component of the two components contact glue has been provided on the parts 11'. retained by the suction tubes 29.

FIG. 5b shows how the suction tubes 29 press the parts 11' exactly onto the locations on the printed circuit board 41 provided with contact glue.

FIG. 5c shows the mounting step in which plate-shaped parts 11' of different thicknesses are simultaneously transferred to the printed circuit board 41 by the suction tubes 29 by release of the pressure deficiency, the parts being retained on the board by the reaction of the glue components, and the suction tubes 29 being withdrawn.

FIGS. 6a and 6b show a device for applying glue to the parts 11' retained by the suction tubes 29. Stamp means 55 comprising a stamping portion 57 consisting of an elastic material are resiliently retained in a plate 53. In order to take up glue 50 from a glue container 61, the plate 53 is moved in the direction of the glue container 61 so that a quantity of glue 59' is picked up by the tips of the stamping portions 57. The transfer plate 31 and the calibration plate 27 are positioned so that the glue 59' present on the stamps 55 is transferred by the lowering of the plate 53, to the plate-shaped parts 11' which are retained on the transfer plate 31 by means of the suction tubes 29.

FIG. 6b shows the plate-shaped parts 11' provided with glue 59.

Figures 7A, 7B:
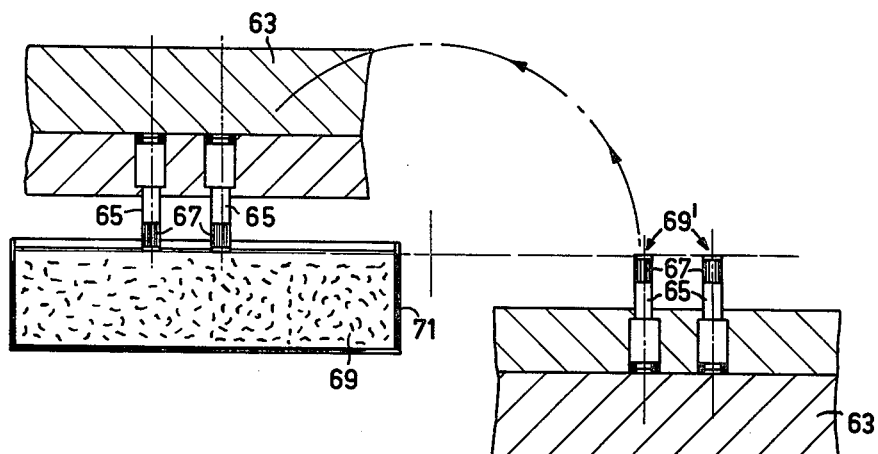
Figures 7C, 7D:
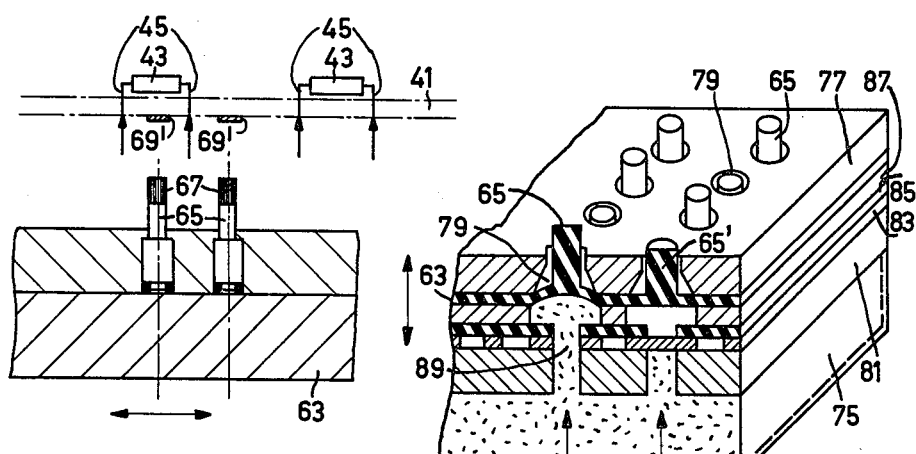

FIGS. 7a, 7b and 7c show a device for applying glue to the printed circuit board 41. Stamps 65 are resiliently mounted in a plate 63. The stamps 65 comprise a stamping portion 67 which consists of an elastic material. For taking up glue 69 from a glue container 71, the plate 63 is moved towards the glue container 71 so that a quantity of glue 69' is picked up by the tips of the stamping portions 67. The printed circuit board 41, already provided with the parts 43 which comprise connection wires 45, is positioned so that the glue 69' on the stamps 65 is transferred, by movement of the plate 63, to the locations on the printed circuit board 41 where the plate-shaped parts 11' are to be arranged.

FIG. 7c shows the printed circuit board 41 provided with the glue 69'.

FIG. 7d shows a further embodiment of the device for applying glue to the locations of the printed circuit board where parts are to be mounted; however, this device can also be used for applying glue to the parts. The stamps 65 which are made of the same elastic material as the plate 63 (for example, rubber) are rigidly mounted on the plate 63 and their number and position correspond to the maximum number of locations to be provided with glue in one operation.

If only a selected number of locations is to be provided with glue by means of this embodiment of the device in accordance with the invention in one operation, a template 83 which has openings 89 which correspond to the locations to be provided with glue is arranged between the plate 63 with the stamps 65 and a distribution box 75 for a pressure medium, for example, air.

Over the elastic plate 63 there is arranged a stationary hole mask 77 which has a number of holes 79 whose distribution corresponds to the maximum number of locations to be provided with glue in one operation. The stamps 65 are transported through the holes 79 of the hole mask 77, for example, by means of compressed air which is transported by the distribution box 75, via a first hole plate 81, the template 83 arranged over the hole plate 81, a cover plate 85 and a second hole plate 87, to the elastic plate and which presses the stamps 65 upwards at the locations where openings 89 are present in the template 83.

FIGS. 8a to 8d diagrammatically illustrate the extremely accurate positioning of the parts 11 by means of the calibration plate 27. As has already been stated, the calibration plate 27 is constructed as a matrix in which conical portions comprising openings 19 can be separately arranged. Until the instant at which plate-shaped parts 11 are situated in the vicinity of the calibration plate 27 (see FIG. 8a), this plate is shifted, together with the transfer plate 31, in the y-direction (FIG. 8b) and in the x-direction (FIG. 8c), until the parts 11 taken along in the openings 19 of the calibration plate 27 are accurately aligned with respect to the locations on the printed circuit board where parts are to be provided (FIG. 8d). The shifting of the calibration plate 27 in the x and/or y direction not only serves for the accurate positioning of the parts 11, but also provides protection against double pick-up of parts; moreover, after the shifting the calibration plate thus serves as a cover for the other parts stacked in the magazines.

FIGS. 9a to g illustrate the cooperation between the calibration plate 27 and the transfer plate 31. The transfer plate 31 and the calibration plate 27 are arranged at such a distance from each other that the suction tubes 29 of the transfer plate 31 project just so far into the openings 19 of the calibration plate 27 that a free space remains in the openings 19 which corresponds to the thickness of the parts 11 to be taken up from the magazines 1 which are arranged directly underneath the calibration plate 27 in the frame 5 (see FIG. 9a).

FIG. 9b shows a part 11' in the opening 19 in mechanical contact with the suction tube 29. In order to ensure that the part 11' present in the opening 19 is properly removed from the stack of parts 11 in the magazine 1, and in order to prevent other parts from also being picked up, the calibration plate 27 is shifted together with the transfer plate 31 so that the openings of the magazines 1 are covered by the calibration plate 27 (see FIG. 9c). In order to enable further handling of the part 11' present in the opening 19 of the calibration plate 27, for example, from the same side, the transfer plate 31 and the calibration plate 27 are turned over together (see FIG. 9d), regardless of the situation of the openings of the magazines 1.

FIG. 9e shows the transfer plate 31 and the calibration plate 27 in the turned-over condition and the part 11' present in the opening 19 is provided with a quantity of glue 59'. Subsequently, a calibration step of the calibration plate 27 is performed, preferably directly before the mounting of the parts 11' on the printed circuit board in order to realize accurate alignment and positioning of the parts 11'. To this end, the calibration plate 27 is shifted in the x and/or y direction so that the parts 11' to be transferred to the printed circuit board are guided by at least one sidewall of the openings 19 (see FIG. 9f).

Subsequently, the transfer plate 31 is moved in the direction of the printed circuit board 41 so that the suction tubes 29 and the parts 11' retained thereby pass through the openings 19 of the calibration plate 27 and the parts 11' reach the locations 73 on the printed circuit board 41 where they are arranged. When use is made of a two-component glue, prior to the mounting of the parts 11' on the printed circuit board 41 one component of the glue 69 is applied to the locations 73 where the parts are to be mounted, and in that case the other component of the two component glue is applied to the parts 11' as the glue 59'.

FIG. 10 illustrates the principle of a pressure-controlled transport system for the transport of the parts 11 stored in the magazines 1.

For the transport of the parts 11 in the direction of the suction tubes 29 situated opposite the stacks, the transport pistons 15 are arranged in a distribution box 14, for a pressure medium 34 which comprises a system of communicating spaces, i.e. the space 16 and the bores 18. The bores 18 on the one hand guide the transport pistons 15 but on the other hand they communicate with the space 16 according to the principle of communicating vessels. The space 16 is closed on both ends, at one end by way of a seal 20 and at the other end by way of a switching piston 24 which is loaded by a spring 22 and whereto there is secured, for example, a plunger 26 which is passed through the wall of the distribution box 14. When the distribution box 14 with the transport pistons 15 is moved, by means of the pressure controlled drive 12, in the direction of the parts 11 of different thicknesses which are situated opposite the transport pistons 15 in the magazines 1, the needle-shaped tip 17 of each transport piston 15 will first make mechanical contact with a part stack which is bounded on the other side by the suction tube 29; when the distribution box 14 is moved further in the direction of the stack of parts, a slight excess pressure will occur in the system formed by the space 16 and the bores 18, so that the other transport pistons 15 are also pressed upwards so that each piston contacts a stack of parts or a dummy 28 instead of parts. When the distribution box 14 is moved further towards the stacked parts 11, the pressure in the system formed by the space 16 and the bores 18 increases further and the switching piston 24 is pressed outwards, so that a pressure sensor or, for example, the plunger 26 connected to the switching piston 24, ultimately operates a switch 30 which terminates the movement of the distribution box 14 by deactivation of the drive 12, thus reducing the pressure on the pressure medium 34. Parts 11 are then picked up by the suction tubes 29 and are removed from the relevant stacks of parts. When the pressure in the system decreases, the switching piston 24 is pressed back into the system by the spring 22 and a new step may commence. In order to switch off the suction or retaining action of the suction tubes 29 at the areas where dummies 28 are present, the relevant suction tubes 29 are provided with caps 32.

Either a gas or a viscous, notably paste-like liquid which cannot be compressed, can be used as the pressure medium 34 in the system formed by the space 16 and the bores 18.

FIG. 11 shows the method of mounting parts on printed circuit boards by means of the device shown in FIGS. 1 to 10.

The printed circuit boards 41 to be provided with parts are provided with glue at the areas 73 where parts are to be arranged by means of glue stamps 65 which are arranged on the plate 63 and which are first dipped into the glue container 71.

Parts 11 are removed from the magazines in the matrix holder 3 by means of the suction tubes which are provided in the transfer plate 31, and glue 59 is applied from the glue station K to these parts 11'.

The printed circuit board 41 provided with glue at the locations 73 where parts are to be provided is so positioned with respect to the transfer plate 31 that the parts 11' provided with glue 59' can be positioned in the locations 73.

What is claimed is:

1. Apparatus for mounting plate-shaped electrical parts on a printed circuit board, which comprises a plurality of hollow tubular magazines each containing a stack of said parts, said magazines being positioned in a manner corresponding to the intended arrangement of the parts on the printed circuit board; a transfer plate positioned opposite one end of each magazine; and a plurality of suction tubes removably mounted in said transfer plate for transferring the parts and extending toward the magazine ends, the number of said suction tubes corresponding to the number of said magazines, said suction tubes being interchangeable to enable the extended length of each tube to be varied as required.

2. Apparatus according to claim 1, in which the suction tubes are adjustably mounted in the transfer plate for slight axial displacement with respect thereto.

3. Apparatus according to claim 1 or 2, in which the suction tubes have a cross-section corresponding proportionally to the cross-section of the parts.

4. Apparatus according to claim 3, in which the suction tubes are round.

5. Apparatus according to claim 1 or 2, in which the lengths of the individual suction tubes extending from the transfer plate differ and correspond to the differences in thickness of the parts to be transferred by the individual suction tubes.

6. Apparatus according to claim 1 or 2, which includes a calibration plate between the transfer plate and the magazine ends, said calibration plate cooperating with the transfer plate and being slidable in the x and/or y direction with respect thereto, said calibration plate having a number of openings corresponding respectively to the parts to be transferred, the suction tubes extending into said openings in accordance with the thickness of the respective parts to be transferred.

7. Apparatus according to claim 1 or 2, which includes stamp means arranged in a plate for applying glue to the printed circuit board and/or to the parts, the number and the position of said stamp means corresponding to the locations of the parts to be transferred.

8. Apparatus according to claim 7, in which the stamp means are resiliently mounted in the plate.

9. Apparatus according to claim 1 or 2, which includes a plurality of matrix frames each having corresponding openings in which the respective magazines can be positioned, the matrix frames being spaced from each other, the distance between each pair of matrix frames increasing in the direction away from the transfer plate.

10. Apparatus according to claim 9, in which the cross-section of the openings in the respective matrix frames decreases in the direction away from the transfer plate.

11. Apparatus according to claim 1 or 2, which includes transport pistons for the simultaneous, individual step-wise movement of the parts stacked in the respective magazines.

12. Apparatus according to claim 11, in which the transport pistons each include a needle-shaped tip for engagement with the respective stack of parts.

* * * * *